United States Patent
Bow et al.

(10) Patent No.: US 10,718,606 B2
(45) Date of Patent: Jul. 21, 2020

(54) DETERMINATION OF CUSTOMIZED COMPONENTS FOR FITTING WAFER PROFILE

(71) Applicant: NIKON CORPORATION, Tokyo (JP)

(72) Inventors: Travis D. Bow, East Palo Alto, CA (US); Henry Pang, Foster City, CA (US); Fardad A. Hashemi, Moraga, CA (US)

(73) Assignee: Nikon Corporation, Tokyo (JP)

( * ) Notice: Subject to any disclaimer, the term of this patent is extended or adjusted under 35 U.S.C. 154(b) by 373 days.

(21) Appl. No.: 15/099,346

(22) Filed: Apr. 14, 2016

(65) Prior Publication Data

US 2016/0305772 A1    Oct. 20, 2016

Related U.S. Application Data

(60) Provisional application No. 62/148,858, filed on Apr. 17, 2015.

(51) Int. Cl.
*G01B 11/24* (2006.01)
*G03F 7/20* (2006.01)

(52) U.S. Cl.
CPC ......... *G01B 11/24* (2013.01); *G03F 7/70783* (2013.01); *G01B 2210/56* (2013.01)

(58) Field of Classification Search
None
See application file for complete search history.

(56) References Cited

U.S. PATENT DOCUMENTS

| 5,493,402 | A | 2/1996 | Hirukawa |
| 6,331,927 | B1 | 12/2001 | Overgaard |
| 7,589,832 | B2 | 9/2009 | Den Boer et al. |
| 8,423,125 | B2* | 4/2013 | Rousso ................. A61B 5/415 250/363.01 |
| 8,445,851 | B2* | 5/2013 | Rousso ................. A61B 5/417 250/363.02 |
| 8,606,349 | B2* | 12/2013 | Rousso ................. A61B 5/418 424/9.1 |
| 8,644,910 | B2* | 2/2014 | Rousso .............. A61B 5/02755 250/370.09 |
| 8,694,928 | B2 | 4/2014 | Cao et al. |

(Continued)

OTHER PUBLICATIONS

Mark Richardson "Principal Component Analysis", May 2009 (Year: 2009).*

(Continued)

*Primary Examiner* — Telly D Green
(74) *Attorney, Agent, or Firm* — Van Pelt, Yi & James LLP

(57) ABSTRACT

Method and system for defining basis functions for fitting distortions of profiles of objects in a batch, that has undergone a fabrication process, in a manner adaptable to the fabrication process to reduce the errors between profiles approximated with the use of such basis functions and actual object profiles. Process-specific individual basis functions are defined based on spatially-dense measurement of objects from training sub-set of the batch and applying learning algorithm to results of such measurement. Advantages of process-adaptable basis functions over generic basis functions for fitting distortion shapes of objects include higher accuracy of fitting either at larger or a fewer locations across the object.

20 Claims, 7 Drawing Sheets

Intended Shape

Distorted Shape

(56) References Cited

U.S. PATENT DOCUMENTS

| | | | |
|---|---|---|---|
| 9,009,647 B2* | 4/2015 | Ye | G06F 30/00 |
| | | | 716/132 |
| 9,040,016 B2* | 5/2015 | Rousso | A61B 5/411 |
| | | | 424/1.11 |
| 9,269,022 B2* | 2/2016 | Rhoads | G06K 9/00208 |
| 9,299,620 B2 | 3/2016 | Horikoshi | |
| 9,316,619 B2* | 4/2016 | Lombardo | G01N 27/902 |
| 9,316,743 B2* | 4/2016 | Rousso | G01T 1/1603 |
| 9,354,526 B2* | 5/2016 | Vukkadala | G01B 9/02021 |
| 2002/0122990 A1* | 9/2002 | Inoue | G03F 1/84 |
| | | | 430/5 |
| 2005/0183821 A1 | 8/2005 | Parsons | |
| 2006/0169208 A1* | 8/2006 | Shinozaki | G03F 7/7075 |
| | | | 118/715 |
| 2007/0292777 A1* | 12/2007 | Melvin | G03F 1/36 |
| | | | 430/30 |
| 2010/0245795 A1 | 9/2010 | Hashemi et al. | |
| 2011/0172982 A1* | 7/2011 | Veeraraghavan | G01N 21/9501 |
| | | | 703/13 |
| 2012/0120198 A1* | 5/2012 | Yu | G01B 11/24 |
| | | | 348/46 |
| 2013/0089935 A1* | 4/2013 | Vukkadala | G01B 9/02021 |
| | | | 438/5 |
| 2013/0155385 A1 | 6/2013 | Hashemi et al. | |
| 2013/0232457 A1* | 9/2013 | Ye | G03F 1/144 |
| | | | 716/53 |
| 2013/0258310 A1 | 10/2013 | Smilde et al. | |
| 2014/0134923 A1* | 5/2014 | Brake | B24B 7/228 |
| | | | 451/5 |
| 2014/0282644 A1* | 9/2014 | Terrazas | H04N 21/442 |
| | | | 725/12 |
| 2014/0368639 A1* | 12/2014 | Wu | G01B 11/00 |
| | | | 348/136 |
| 2015/0035523 A1* | 2/2015 | Lombardo | G01N 27/902 |
| | | | 324/240 |
| 2016/0239956 A1* | 8/2016 | Kang | G06T 17/005 |
| 2016/0274060 A1* | 9/2016 | Denenberg | G01N 27/9046 |
| 2016/0372353 A1* | 12/2016 | Vukkadala | G01B 9/02021 |

OTHER PUBLICATIONS

Cherry et al. "Multiblock Principal Component Analysis Based on a Combined Index for Semiconductor Fault Detection and Diagnosis", IEEE, vol. 19, May 2, 2006, pp. 159-172 (Year: 2006).*

Lam, et al., Pattern Recognition and Data Mining Techniques to Identify Factors in Wafer Processing and Control Determining Overlay Error, Proc. of SPIE, 2015, vol. 9424, pp. 94241L-1 thru 94241L-10.

Lee, et al., Reduction of In-Lot Overlay Variation with Integrated Metrology, and a Holistic Control Strategy, Proc. of SPIE, 2015, vol. 9635, pp. 96351S-1 thru 96351S-7.

Ruijl, et al., Thermal Effects in Mechatronic Systems: A System Level Approach to Thermal Design and Modeling, ASPE Tutorial 2012, Philips Innovation Services, 136 pages.

* cited by examiner

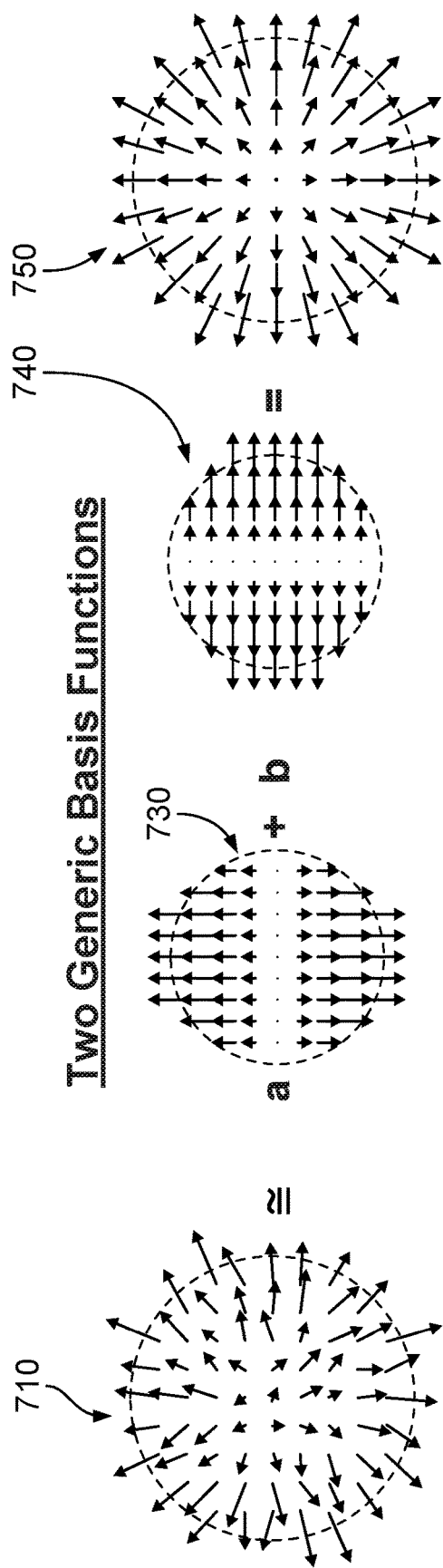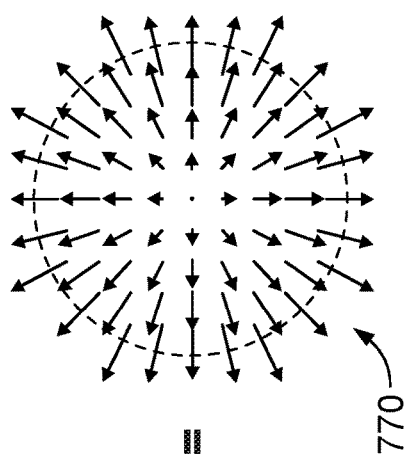
FIG. 7A
FIG. 7B

_US 10,718,606 B2_

DETERMINATION OF CUSTOMIZED COMPONENTS FOR FITTING WAFER PROFILE

CROSS-REFERENCE TO RELATED APPLICATIONS

This patent application claims benefit of and priority from the U.S. Provisional Patent Application No. 62/148,858 filed on Apr. 17, 2015 and titled "Method for Determining Customized Components for Fitting Wafer Profile". The disclosure of that provisional application is incorporated by reference herein.

TECHNICAL FIELD

The present invention relates to measurements of shapes of objects and, in particular, the methods for reduction of number of measurements, performed at precision workpieces such as semiconductor wafers, that is required for determination of distortions of surface(s) of the precision workpieces.

BACKGROUND

In currently-adopted practice of compensating the semiconductor wafer distortions (prior to the exposure of the wafer in a lithographic exposure tool and/or processing the wafer otherwise), the tools used for fitting the measured distortion data include the so-called Enhanced Global Alignment basis functions (referred to hereinafter as the EGA basis functions). The EGA basis functions utilize six functions—x-shift, y-shift, x-magnification, y-magnification, rotation and orthogonality. The EGA basis functions have been adapted in wafer alignment and wafer-distortion related applications for a long time because they provide adequate least squares fitting. As precision requirements in lithography continue to increase, however, and as the wafer-distortion pattern-fitting requirements become tighter and tighter (for example, both in wafer-bonding and lithographic applications the absolute values of acceptable fitting errors are now drastically reduced and, in some cases, cannot amount to more than a minute fraction of a micron), EGA functions alone may no longer be adequate. Accordingly, there exists a need and motivation for the development of alternative functions providing practical advantage over the existing EGA set of functions to achieve better fitting results with robust and repeatable accuracy characterized by very small spatial errors.

SUMMARY

Embodiments of the invention provide a method for determining spatial profiles of objects from a set of objects. The method includes a step of measuring, with a shape-profiling tool and for each object from a first subset of objects in said set, a corresponding spatial profile at M spatial locations across the object from the first subset i) to determine a measured spatial profile, and ii) to define a pre-determined number of basis spatial functions a combination of which approximates the measured spatial profile of each of the objects from the first set. The method additionally includes a step gauging, with the shape-profiling tool and for each object from a second subset of objects in said set, a corresponding spatial profile at a pre-determined number m of spatial locations across the object from the second set to define profile data. The method further includes a step of defining an approximated profile for each of objects in the second subset by fitting the profile data with a linear combination of the basis spatial functions. In a specific case, the definition of the pre-determined number of basis spatial functions (a combination of which approximates the measured spatial profile of the objects) may be effectuated with the use of a Principal Component Analysis technique (PCA).

A related embodiment provides for a method for determining spatial profiles of objects, which method includes (i) with a shape-profiling tool and for each object from a first subset of the objects, measuring a corresponding spatial profile with M sensors of the tool to define a pre-determined number of basis spatial functions, a combination of which approximates a measured spatial profile of each of the objects from the first subset; and (iii) defining an approximated spatial profile for each of objects in the second subset of the objects by fitting profile data, obtained from a measurement of each of the objects in the second subset with m sensors, with a combination of the pre-determined basis spatial functions. In a specific implementation, the pre-determined basis spatial functions forming the combination are determined with the PCA.

Further, a method is provided that includes determining an approximated spatial profile for each of the objects by fitting profile data, obtained from a simultaneous optical measurement of one subset of the objects at M locations across each object, with a set of basis functions that have been defined from a simultaneous optical measurement of another subset of the objects at m locations across each object. In the specific case, the basis functions have been pre-defined with the use of the PCA.

An embodiment provides for a method for determining spatial profiles of precision workpieces from a set of precision workpieces produced in the same precision process, the method includes steps of a) with a shape-profiling tool and for each precision workpiece from a first subset of the set, measuring a corresponding shape at M spatial locations across said precision workpiece to determine measured shapes of the precision workpieces in the first subset; b) using a numerical analysis technique to define customized basis spatial functions from the measured shapes of the precision workpieces in the first subset, where the customized basis spatial functions are defined such that a combination thereof approximates each of the measured shapes; c) with the shape-profiling tool and for each precision workpiece from a second subset of the set, measuring a corresponding shape at m spatial locations across the precision workpiece to define measured shapes of the precision workpieces in the second subset; and d) defining an approximated shape for each of the precision workpieces in the second subset by fitting the measured shapes of the precision workpieces in the second subset with a linear combination of the customized basis spatial functions.

Embodiments further provide for a system that includes at least one of (i) a lithographic exposure tool having an optical projection system and (ii) a precision workpiece bonding apparatus; a spatial profiling tool. The system further includes (iii) programmable electronic circuitry in operable communication with at least one of the lithographic exposure tool and the spatial profiling tool, and (iv) tangible, non-transient storage memory in electronic communication with the circuitry, the memory having thereon program code configured to cause the circuitry to determine spatial profiles of precision workpieces processed with the exposure tool in the same precision process by at least a) determining customized basis functions by assessing data representing the precision workpieces with a precision process analysis technique; b) causing the spatial profiling tool to measure, for every precision workpiece from said set, a corresponding spatial profile of a precision workpiece at m spatial locations across said precision workpiece to define measured spatial profiles of the precision workpieces; and c) defining an approximated spatial profile for each of the precision workpieces by fitting said measured spatial profiles with a combination of the customized basis spatial functions.

BRIEF DESCRIPTION OF THE DRAWINGS

The invention will be more fully understood by referring to the following Detailed Description of Specific Embodiments in conjunction with the Drawings, of which:

FIGS. 7A and 7B are diagrams illustrating related embodiments of the invention.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

Figure 1:
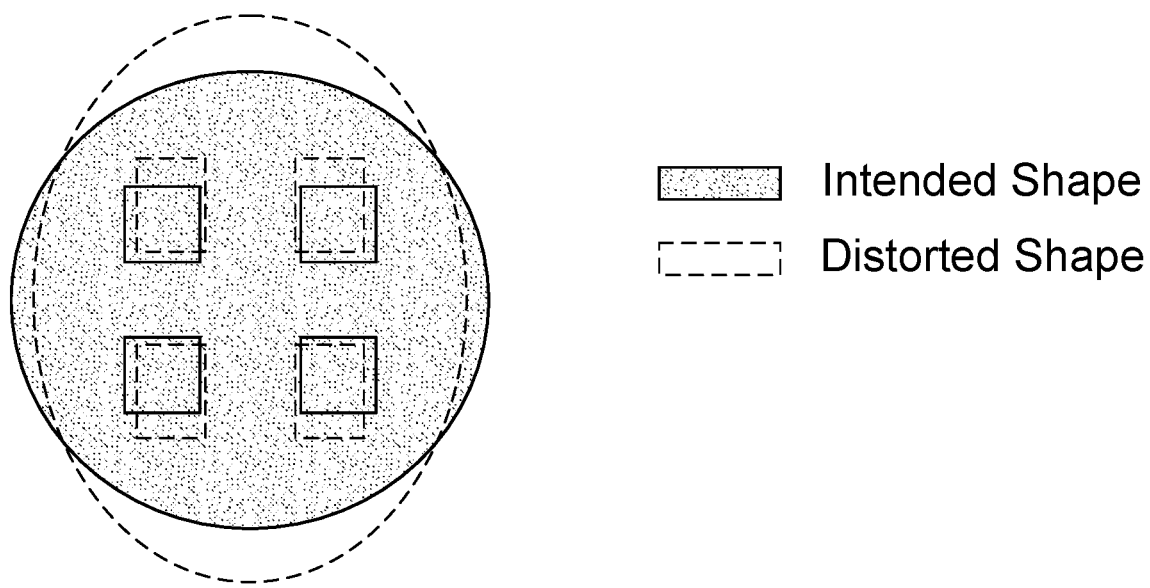
FIG. 1 is a diagram illustrating a distorted semiconductor wafer.

In lithographic production, silicon wafers commonly undergo various treatment processes that can induce distortions in the wafers, whether through mechanical, thermal, or chemical effects. The terms "distortion" and/or "distortion profile" as used herein generally refer to physical distortions of a wafer (such as elastic in-plane deformations, for example), but it can also be associated with printed patterns on the wafer that have distorted features. Distortions may originate anywhere on a wafer and, depending on a particular wafer-treatment process causing these distortions, they can have different spatial patterns and magnitudes. Distortions of the wafers are, in turn, the cause of many practical issues. For example, they can lead to the degradation of the integrity of printed patterns on the wafer (by, for example, causing overlay errors in lithographic patterning), or complicate wafer alignment in a lithographic exposure system, or affect the results of wafer bonding; see FIG. 1.

Lithographic exposure apparatus (or exposure tools, for short) are commonly used to transfer images from a reticle onto a semiconductor wafer during semiconductor processing and/or fabrication of flat panel displays such as LCDs. A typical exposure apparatus, used for transfer of a pattern from a reticle onto a substrate of interest (interchangeably—a target substrate or a wafer, such as a semiconductor wafer during the semiconductor processing) includes an illumination source, a reticle stage assembly (that positions a reticle within the apparatus), an optical assembly containing the so-called projection optics, and a wafer stage assembly (that positions the target substrate or a wafer). The exposure apparatus also includes a measurement system (that monitors positions of the reticle and the target substrate) that employs an encoder head, and a control system that governs operations of various assemblies to adjust, when required, mutual positioning of the reticle and the target substrate. The geometrical features of patterns transferred from the reticle onto the target substrate are extremely small, which imposes extremely tight requirements on precise positioning of the target substrate and the reticle to manufacture high-quality patterned semiconductor wafers. An example and description of an embodiment of the lithographic exposure tool is disclosed, for instance, in reference to FIG. 1 of the co-assigned U.S. patent application Ser. No. 15/014,677, the disclosure of which is incorporated by reference and provides various features and principles of operation of an exposure tool with which, in some cases, embodiments of the present invention may be used. Additional descriptions of related embodiments of a lithographic tool(s) used for similar and/or related applications are provided in U.S. patent application Ser. Nos. 13/818,567, 62/095,583, and 12/721,493, for example, the disclosure of each of which is incorporated by reference herein as well. For that reason, a typical lithographic exposure tool is not described herein in any additional detail.

Wafer bonding includes a process during which two (silicon) wafers are aligned with respect to one another and then bonded together by, for example, a combination of high clamping force and applied heat. In order to ensure that the post-bond circuit structures formed on the wafers function properly, it is required that all of the mutually-corresponding circuit patterns on the two individual wafers be aligned properly prior to bonding. If the circuit patterns are aligned with an error offset caused by existing wafer distortions, the drawbacks of the operation of the post-bond circuit structures is known to range from partial functional degradation to failure. An example and description of an embodiment of the bonding apparatus and method is disclosed, for instance, in the co-assigned U.S. patent Ser. No. 09/299,620, the disclosure of which is incorporated herein by reference and provides various features and principles of operation of the substrate bonding apparatus with which, in some cases, embodiments of the present invention may be used. For that reason, a typical substrate bonding apparatus is not described herein in any additional detail.

It is understood, therefore, that in order to resolve wafer alignment errors caused by wafer distortions, such distortions need to be compensated or corrected. The methods of related art employed for this purpose include a sequence of steps:

i) Measurement of distortions of the two wafers that are to be bonded to identify distortion patterns. Here, it is understandable that the first of the wafers to be bonded (often referred to as the bottom wafer) and the second wafer (the top wafer) may have different distortion patterns.

ii) Computation of the difference between the distortion patterns. The resulting value of difference becomes the aggregate amount of correction that must be applied to the wafers (for example, to only one of the wafers) such that in the end the wafers have similar profiles. (While it is possible to correct both wafers to end up with zero distortions, the correction of the distortions of only one of the two wafers proved to be more practical).

iii) Next, the distortions of a chosen wafer are corrected as known in the art with the use of, for example, lithography stage, lithography lens, and actuators.

iv) Finally, the top wafer is then aligned and bonded to the bottom wafer.

Figure 2A:
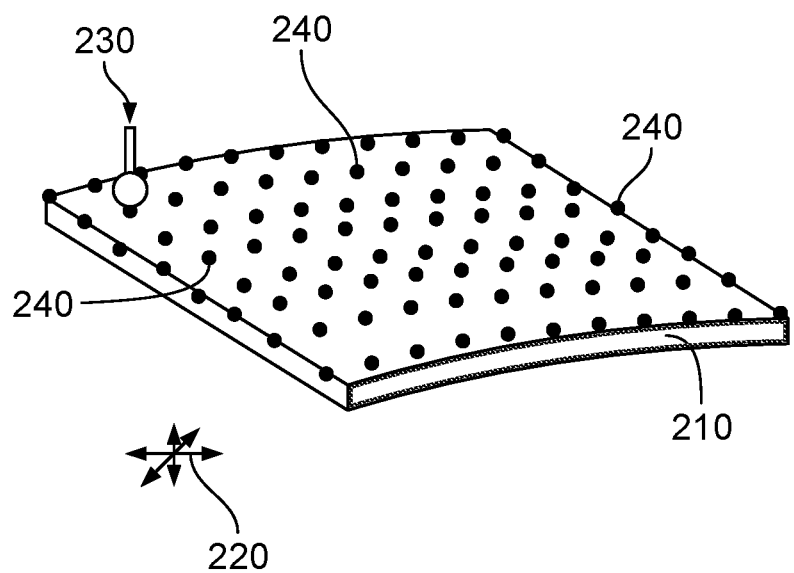
FIG. 2A is a schematic diagram showing a multiplicity of points at which a surface profile is measured across the wafer of FIG. 1.
Figure 2B:
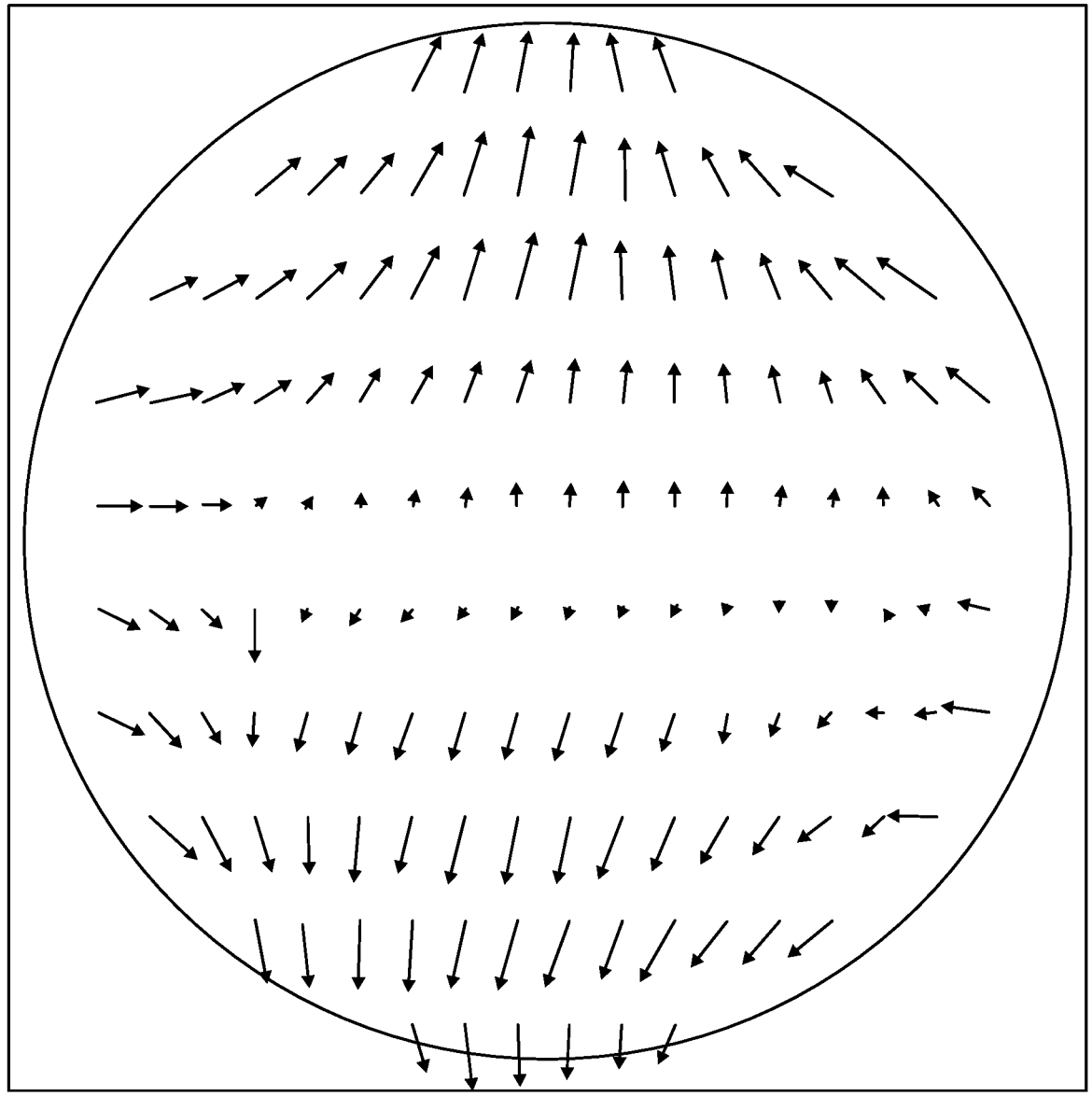
FIG. 2B illustrates a map of distortions measured across a surface of the wafer of FIG. 2A, presented in a vector form.
Figure 3A:
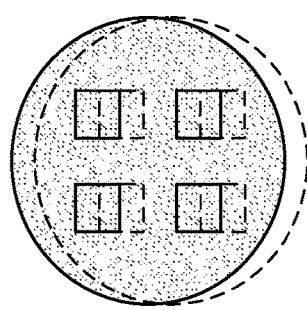
FIGS. 3A, 3B, 3C, 3D, 3E, and 3F illustrate six (6) generic shapes or functions used in related art for fitting shape distortions.
Figure 3B:
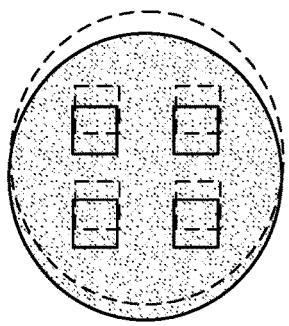
Figure 3C:
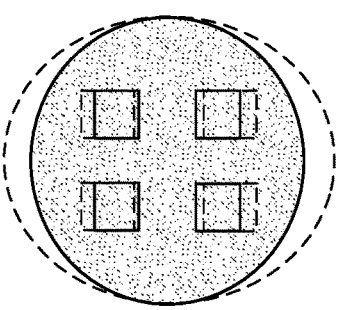
Figure 3D:
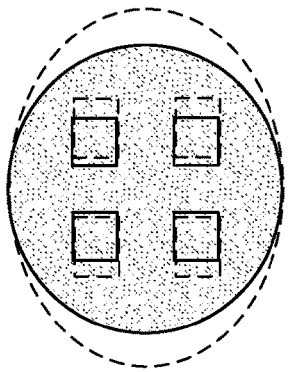
Figure 3E:
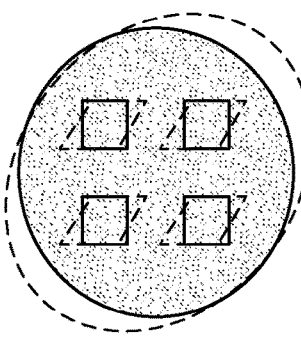
Figure 3F:
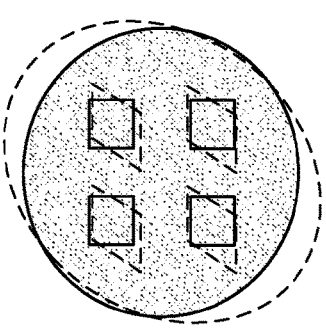

The scope of the present disclosure is a distortion-measurement methodology. Currently, the measurement of wafer distortions is conducted in related art as follows:

In reference to schematic diagrams of FIG. 2A and FIG. 2B, the wafer 210 of interest is first secured at a distortion measurement system that includes at least two subsystems. The first subsystem utilizes the actuator 220 (interchangeably referred to as the "stage"), while the second subsystem 230 contains the sensor(s) configured to perform the actual wafer-distortion measurements. During the measurement process, the stage 220 moves the wafer 210 to different target positions in order for the sensor(s) to take distortion measurements at a multiplicity of different points 240 across the wafer's field; see FIG. 2A. An example of planar distortion expressed as a vector-map is shown in FIG. 2B, in which the individual vectors schematically illustrate a deviation from a surface that is not stretched or otherwise distorted in the xy-plane at corresponding surface points 240. It is appreciated that, in a specific case, embodiments of the invention are directed to measurements of in-plane distortions that do not alter the three-dimensional (3D) profile of a surface of the objects, but rather stretch or shear (or otherwise affect) the shape of such surface in the chosen plane. Generally, however, a measurement of 3D distortions (general distortions of a spatial profile of an object) may be performed, which is within the scope of the present invention.

It is appreciated that in order to obtain a correct distortion profile of the wafer, it is desirable to measure the distortion at copious locations, i.e. everywhere possible across the wafer. The large number of measurement locations, however, creates a trade-off between the time required to complete the measurement and costs involved. Therefore, in practice of actual wafer production (where wafer throughput is critical), the distortion measurements are effectuated only at a few locations. In specific cases, when the study of distortion profiles in greater detail is justified, measuring distortions at many positions across the wafer may still be performed.

Understandably, it would save time if a structure could be measured at only a few points and the results of those few measurement could then be used to calculate a "map" (the distortion everywhere, at any point across the structure). Bridging this data gap is typically effectuated by assuming that the distortion is made up of the sum of a few known distortion shapes.

In this case, the measured distortion profiles of a few selected wafers provide useful data for characterizing distortions that are specific to a given wafer treatment process. The term "characterization" of distortions is used to refer to using several basis functions to fit the measured distortion profiles as accurately as possible. (A basis function is an element of a particular basis for a function space. Every continuous function in the function space can be represented as a linear combination of basis functions, just as every vector in a vector space can be represented as a linear combination of basis vectors.) If the basis functions can fit the distortion profiles with zero residual errors, then such basis functions are considered the perfect, ideal basis functions. (In practice, however, zero residual errors are very difficult to achieve due to a number of reasons such as measurement noise, and random and non-repeatable nature of distortion patterns themselves, for example.)

The so-called Enhanced Global Alignment (EGA) basis functions, combinations of which are commonly used in related art to fit the results of a number of measurements of the wafer distortions, include six (6) shapes or functions (illustrated schematically in FIGS. 3A, 3B, 3C, 3D, 3E, and 3F by showing changes in shapes of a patterned wafer, exposed to distortions described by such individual functions). These functions are referred to as horizontal shift, vertical shift, horizontal stretch, vertical stretch, horizontal shear, and vertical shear, respectively. It is appreciated that some distortion shapes can be viewed as wafer-positioning errors (consider the horizontal shift of FIG. 3A, for example). (Another example of a basis set of basis distortion shapes that are often used in a different field—for correction of distortions and aberrations in optical lenses—is known as Zernike polynomials.)

At the level of fitting precision and accuracy of a fraction of a micron (in different embodiments—of about 30 nm, 50 nm, 100 nm, 500 nm, or, in a specific case 1000 nm), dictated by the current level of technological development, the use of the EGA basis functions is reaching the limit of practical usefulness because the errors/deviations between the real and "mapped" distortion shapes of the wafers exceeds this limit at least at some locations across the wafer when EGA functions are used. The elimination of locations across the wafer, where such deviations exceed the required limit, with the use of only EGA basis functions was empirically determined to be unsuccessful.

Figure 4A:
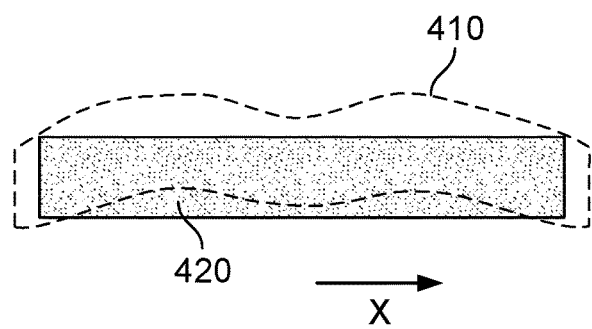
FIGS. 4A, 4B, 4C, and 4D provide an illustration to improvements of a surface-profile estimation performed with the use of basis functions that are specific to and defined anew with respect to an identified set of objects over that performed with a conventionally used generic basis functions.
Figure 4B:
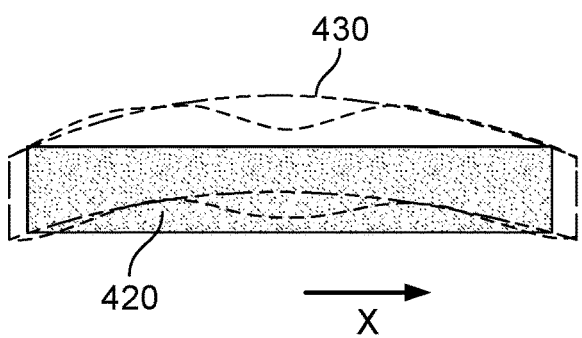
Figure 4C:
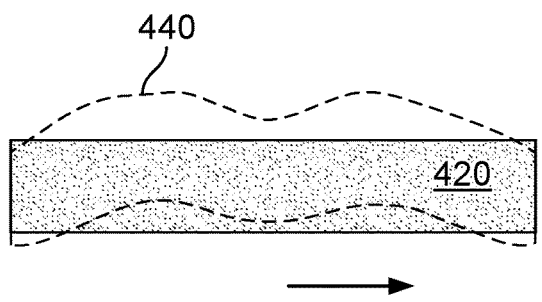
Figure 4D:
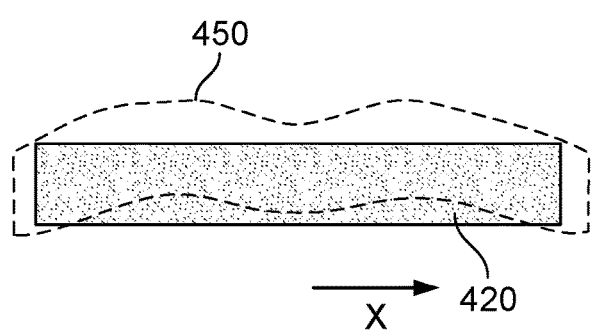

Another shortcoming of the use of the EGA basis functions stems from the fact that this set is generic, in that it is useful when it is known that the distortions present in the object of interest (such as a wafer, for example) are of known generic type. However, when the types of distortions to which the object is subject are not known a priori, the use of a generic set of basis functions (such as the EGA functions) results in higher errors. Indeed, and in reference to an example of the unknown actual distorted shape 410 of a plate 420 in FIG. 4A, under the assumption that the distorted shape 410 resulted from or was caused by the two generic actions of "bending" and "stretching" (along the x-axis, for example) two measurements could be taken and the resulting approximated distorted shape of the plate 420 could be deduced, from the results of these two measurements, to be that shown by line 430 of FIG. 4B. On the other hand, if it were known beforehand that the distortion 410 of the plate 420 was caused by the combination of the "stretching" and "double-bending" (the latter shown by line 440) in FIG. 4C), then the estimation/approximation 450 of the distorted shape 410 (FIG. 4D), made on the basis of the same two measurements, would more closely match the actual distorted shape.

Alternatively, in reference to another example of an unknown actual distorted shape 710 of a wafer shown in FIG. 7A, under the assumption that the distorted shape 710 resulted from or was caused by the two generic shapes of "vertical magnification" 730 and "horizontal magnification" 740, two measurements ("a" and "b") could be taken and the resulting approximated distorted shape of the wafer could be deduced, from the results of these two measurements, to be that shown schematically by the shape 750. On the other hand, if it were known beforehand that the distortion 710 of the wafer was caused by a "coupled magnification" shown as 760 in FIG. 7B, then the estimation/approximation 770 of the distorted shape 710, made on the basis of a single (the only) measurement "c", would closely match the actual distorted shape. This example also shows the advantage of minimizing sensors for the same fitting accuracy (as opposed to improving accuracy with the same number of sensors, discussed above).

Moreover, the systemic error—the one that may be present in the measurement system—is not recognized by the system or otherwise pointed out to the user as a result of employment of a set of generic basis functions such as the EGA for measurements of the wafer at a very large number of locations across the wafer. Indeed, a person of ordinary skill in the art would appreciate that an unexpected, localized deviation of the results of the surface measurements that is present in each and every wafer reading by the system based on the assumed-to-be-correct basis functions will simply be not averaged out by the system and will be preserved, unknowingly to the user corrupting the accuracy of the measurements.

Embodiments of the present invention address the deficiencies of using generic basis functions by establishing a distortion-pattern measurement and fitting methodology that provides operational results consistently exceeding the accuracy that is achievable with the use of the generic (and, in particular, EGA) basis function set and satisfy the required limitation on fitting errors. Specifically, the problem of high cost and time, associated with the need to characterize distortions of substrates at multiple points in order to achieve the required level of accuracy of distortion-fitting, is solved by applying a mathematical learning algorithm to a small subset of the lithographic substrates to define a set of process-specific and adaptable basis functions that not only ensure more accurate characterization within the allotted time but are also adaptable and can be reconfigured depending on the technological process that the wafer is undergoing. In other words, embodiments of the invention effectively "match" a determination of the shape of the wafers' distortion(s) to the process to which the wafers have been exposed. Incidentally—and in contradistinction to the use of the generic basis functions, the use of the "best fit", individual-to-the-process basis functions will average out the unknown systemic error(s), thereby decreasing the measurement errors.

The idea of the invention stems from the realization that a good, reliable, approximation that satisfies the current requirements of precision and accuracy of the actual distorted shape of an object can be produced based on i) the use of a process-specific set of basis functions that have been derived from the multi-point measurement of a small sub-set of the set of the objects, and ii) a-few-point measurement of the remaining objects in the set.

Figure 5:
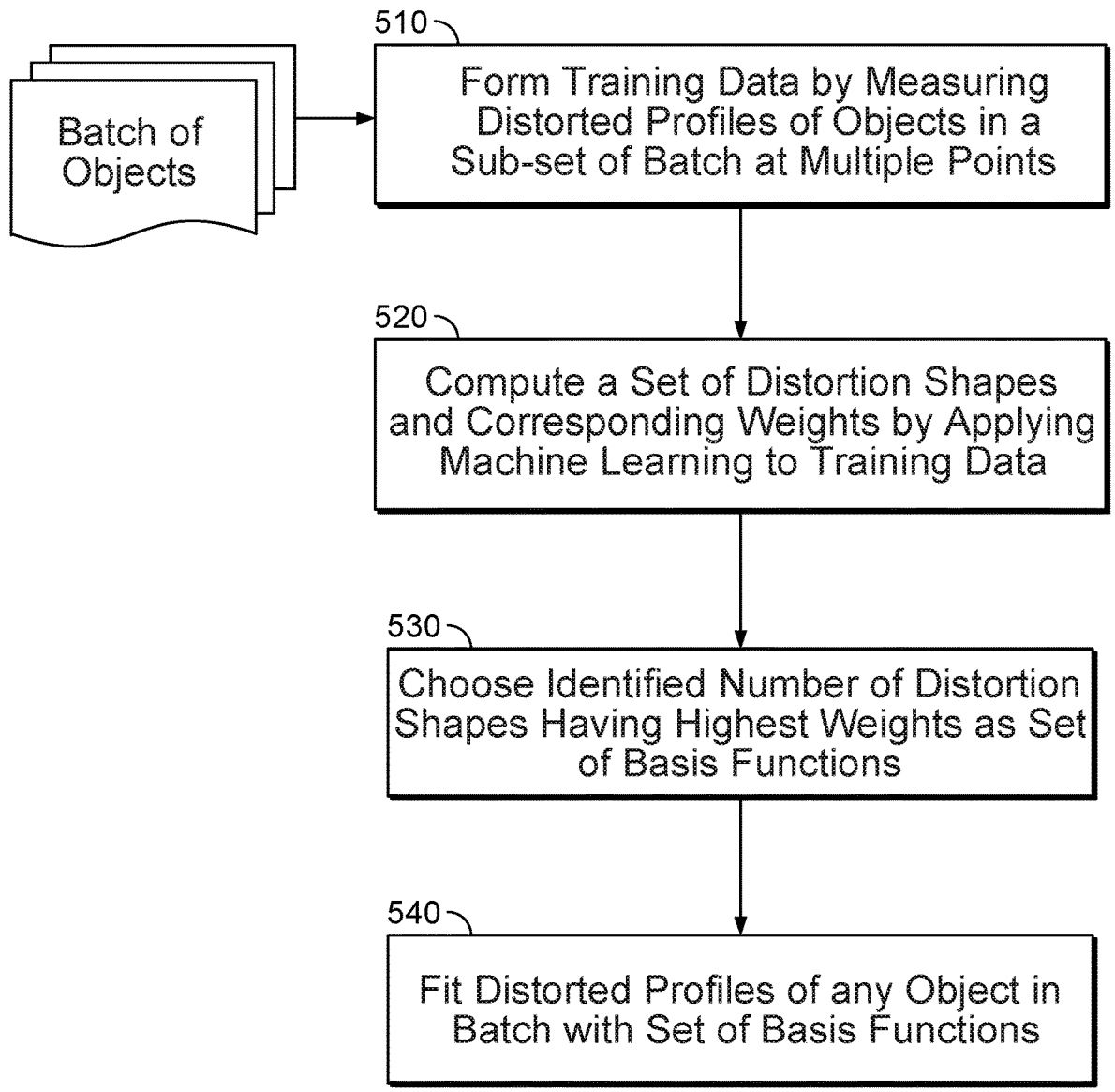
FIG. 5 is a flow-chart illustrating an embodiment of the method of the invention.

FIG. 5 provides a schematic flow-chart of an embodiment of the method of the invention. At step 510, for a specifically identified object-production process, a small subset of objects (in a specific example, wafers) from the batch is taken for distortion measurements at multiple pre-determined locations across such objects. It is appreciated that the exact number of such locations depends, at least in part, on the random noise of the measurement, and in practice may be somewhere on the order of several tens (for example, between 10 and 30) of objects when the number of objects in the complete batch exceeds several hundred (for example, 1000). The results of such spatially-dense distortion measurement may be appropriately stored on a tangible non-transitory storage memory as training or reference data.

At step 520, a machine learning technique configured to learn from the training data is applied to the training data. In a specific non-limiting case, the learning technique referred to known as Principal Component Analysis, or PCA, is used. The PCA is a mathematical methodology that uses orthogonal transformation(s) to convert a set of observations of possibly correlated variables into a set of values referred to as principal components. The principal components are orthogonal because they are the eigenvectors of the covariance matrix, which is symmetric. (See, for example, Jolliffe I. T. *Principal Component Analysis*, Springer Series in Statistics, 2nd ed., Springer, N Y, 2002; ISBN 978-0-387-95442-4). As related to the idea of the present invention, the principal components can be understood as functions that represent distortion-patterns and that are learned from the training data. Each of these principal components carries a "weight" that is the relative contribution of the corresponding principal component to the training data.

At step 530, the identified number of the principal components having the highest weight parameters are chosen as new basis functions. The new basis functions can be used, at step 540, for fitting the distortions of the numerous (for example, thousands of) objects from the batch. The sub-set of objects taken from the batch for fitting with the defined basis functions may be complementary to (completing the whole batch when combined with) the sub-set identified at step 510.

As would be readily appreciated by a skilled artisan, the basis functions determined according to the embodiment of the invention differ from the EGA basis functions is that the former are specific to and, therefore, customized to a particular set of training data that are derived from the production process. Accordingly, the proposed methodology produces basis functions in an adaptable, reconfigurable way based on the process undergone by the batch of objects.

Figure 6:
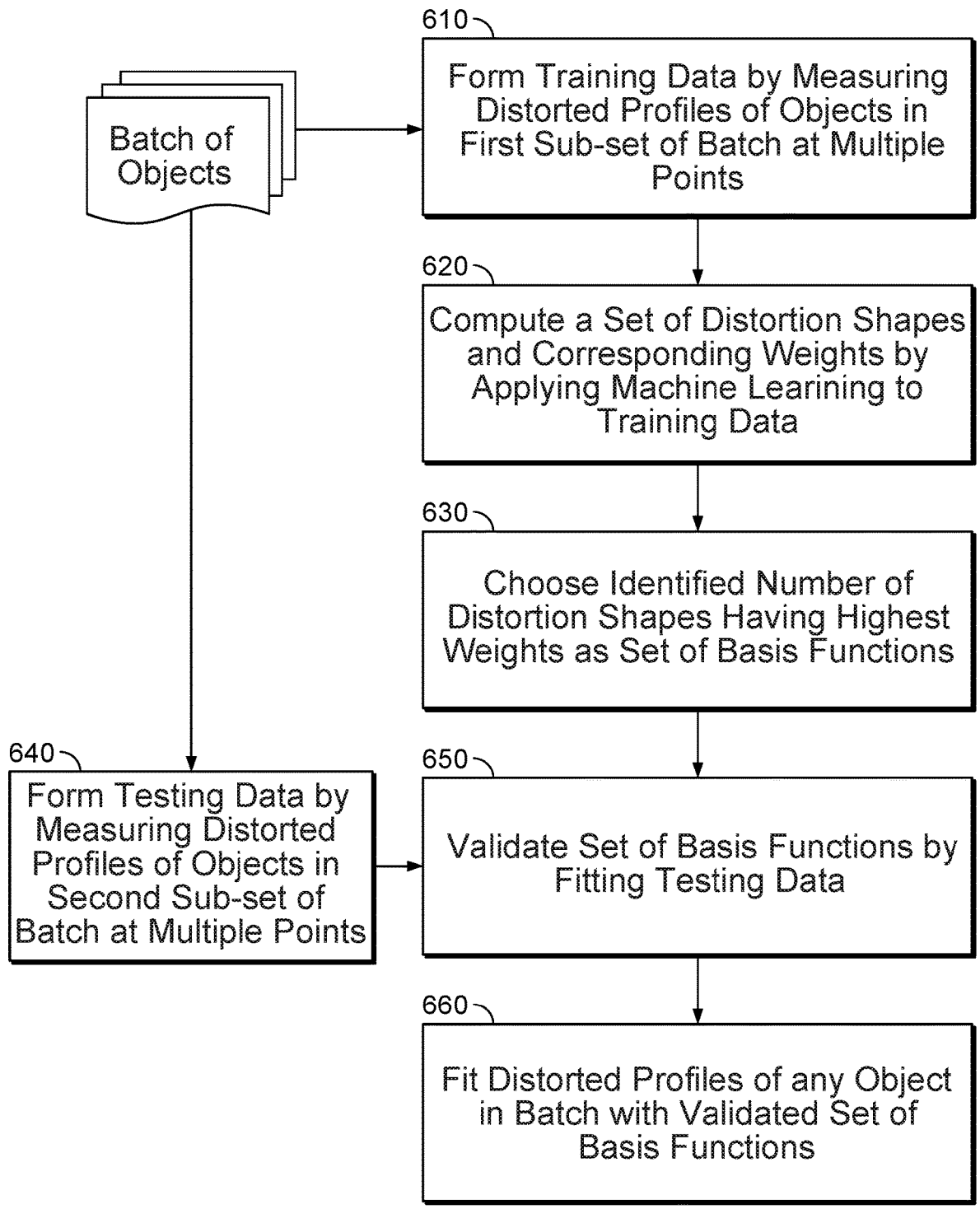
FIG. 6 is a flow-chart of a related embodiment.

FIG. 6 illustrates a flow-chart representative of the second practically implemented embodiment of invention method. Given a specific object production process (in a specific case—the production of semiconductor wafers), a small subset (training set) of objects from the batch is taken, at step 610, for distortion measurements at M numerous pre-determined locations to form training or reference data that may be appropriately stored on a tangible non-transitory storage memory. At step 620, a machine learning technique known as Principal Component Analysis (PCA) is applied to the training data to form principal components (the distortion patterns corresponding to the training data), each of which carries a "weight" describing a relative contribution of a principal component to the distortions of the objects represented by the training data. At step 630, the identified number of the so-determined principal components having the highest weight parameters are chosen as new basis functions. Contemporaneously with or following the steps 610-630, another small subset (testing set) of objects from the batch is to perform, at step 640, the distortion measurements at m locations, to define testing data representing distortions of the objects from the testing set. The testing data may be appropriately stored on a tangible non-transitory storage memory. The set of basis functions newly formed at step 630 is then used at step 650 to fit the testing data and to compute the residual fitting-errors to assess the accuracy and precision of the fitting process. The purpose of the validation step 650 is to increase confidence in the accuracy of the new basis functions. In a related embodiment, multiple sets of testing data for testing the new basis functions can be employed. Once the accuracy of the new set of basis functions is proven to satisfy a pre-determined threshold, the basis functions can be used for fitting the distortions for the thousands of objects from the batch. In a situation when the errors of the fitting process with the use of the chosen new set of basis functions are not necessarily contained below the pre-determined threshold, a modification of the new set can be undertaken by, for example, i) expanding the training set of objects (in one case, by adding the testing data to the training data) and repeating the process of the determination of the new basis functions; and/or ii) expanding the set of new basis functions (by choosing a larger number of the new basis function in the set, to more accurately match higher-order distortions); and/or iii) making a record of the failure to meet the threshold and proceeding with the chosen new set of basis functions. It is understood, however, that defining the new set of basis functions for a given batch of objects (on a batch-to-batch basis, according to the idea of the invention) substantially eliminates a possibility of such situation.

Empirical implementation of the proposed methodology included the following experiments. Starting with the input distortion data representing distortions of 56 semiconductor wafers at numerous locations, the input data were divided into training data (data representing 20 wafers) and testing data (data representing 36 wafers). The PCA was applied to the training data to define the six highest-weighted principal components, which were adapted as the new PCA basis functions. These six basis functions were then used to fit the testing data and, for comparison, the EGA basis functions were also used to fit the testing data. Locations across the wafers where the residual errors (i.e., difference between the fitted distortion estimation and the actual distortion measured at many locations) were in excess of a predetermined fraction of one micron (in one example, 0.1 μm) were counted as "No Good" (or NG) locations. The results are summarized in Table 1, showing the comparison of No Good locations using conventionally used EGA basis functions and No Good locations determined with the use of PCA basis functions defined according to an embodiment of the invention:

TABLE 1

| Testing Set No | EGA Basis Functions | | PCA Basis Functions | |
|---|---|---|---|---|
| Good Locations | NG-x | NG-y | NG-x | NG-y |
| Tally | 99 | 85 | 18 | 20 |
| Total | 184 | | 38 | |

It is apparent that the results achieved with the use of the wafer-process adaptable basis functions defined according to an embodiment of the invention identified approximately five times less No Good locations than those achieved with the use of conventional EGA basis functions. Such "recovery" of the wafer areas that would, otherwise, erroneously be labeled as "No Good" is due to the increased accuracy of the fitting process attributed to the better defined basis functions.

The comparison between the distortion measurement methodology currently employed in related art and that implemented in an embodiment of the present invention begs questions of a) which number of measurement locations is appropriate to achieve the goals of the measurement without excessive expenses and b) whether the advantage provided by the basis functions defined according to an embodiment of the invention is preserved when the number of measurement locations across an object is reduced from many to a few locations. In the case of semiconductor wafer manufacturing, for example, and given that wafers being produced are subjects to tightly controlled, repeatable treatment processes, a skilled artisan can reasonably and validly assume that the type of distortion patterns on many wafers in a batch is generally repeatable, with perhaps the presence of small amounts of random noise. Therefore, the highest weighted basis functions that are computed from the training data according to an embodiment of the invention should also provide good fit for distortions of all other wafers from the same production process.

While the answer to a question of reduction of measurement locations from many to a few is not within the scope of this disclosure, it is recognized that there exist many optimization methods for finding the best few locations for distortion measurements. Generally, the few chosen measurement locations would be i) robust to measurement noise; ii) produce signal data having high signal-to-noise ratio; iii) provide good spatial coverage of the wafer, in terms of radial and angular distance with respect to a predetermined origin; iv) cover regions that are prone to high distortions (specific to the distortion profile).

At the same time, to verify that the new basis functions defined according to an embodiment preserve an advantage over the EGA basis functions when the number of measurement locations is reduced from many to a few, three optimization methods were independently implemented, as briefly discussed below. Each of these methods for intelligent finding of best/optimal locations for measurements had different complexity as the optimization was carried out with respect to different parameters such as, for example, the condition number of the function matrix (hereinafter referred as the Distortion Basis Set (DBS) matrix), performance of fitting in training data, and performance of fitting in testing data. Non-limiting examples of possible verification/optimization approaches outlined schematically below use the following nomenclature: N is the total number of objects (such as wafers) in a subset of objects available from the processed batch; M is the total number of locations at an object and the maximum number of measurements performed at the object; m is a practical number of measurement locations at an object (m<=M); p is a number of PCA shapes to be used; w denotes the best matrices candidates selected in a given method:

Method 1: According to a first method of verification, a pre-determined number of PCA shapes (p; in one implementation—six) were defined as column vectors. These vectors were combined into an M×N matrix, in which each row corresponded to a possible sensor location on the wafer and each column corresponded to a basis function's distortion at that location. The number of desired measurements was chosen (m; in one case, eight), followed by the formation of every possible matrix composed of eight rows of the M×N matrix. Each of so-formed m×N matrices was checked for its condition number (a measurement of a matrix's condition or the independence of its vectors), and a matrix with the lowest (best) condition number was determined. The rows of the matrix with the lowest condition number define the locations of the sensors across the wafer to be measured.

Method 2: According to the second method of verification, Method 1 was first used to choose the top w possible matrices (each of which defines m possible sensor locations). Then fitting on the training data was performed for only the m locations defined by each of these w matrices. The matrix (and the corresponding m locations defined by it) that provide the least error in estimating the shapes of the training data then are chosen for future measurements.

Method 3: Same as Method 2, except the testing data rather than the training data were used to test the performance of a given set of m measurement locations.

The "optimal locations", determined with the use of such optimization methods, were further selected for testing. Table 2 summarizes the comparison of performance of the fitting of the wafer profile with the use of the EGA basis functions with that with the use of the basis functions of an embodiment of the invention, at reduced number of measurement locations across the wafer.

TABLE 2

| Tally of NG Locations from Testing Set (36 wafers) | | | | | | | | | | | |
|---|---|---|---|---|---|---|---|---|---|---|---|
| | 96-loc | | | Method 1 (8-loc) | | | Method 2 (8-loc) | | | Method 3 (8-loc) | | |
| | NG-x | NG-y | Total NG | NG-x | NG-y | Total NG | NG-x | NG-y | Total NG | NG-x | NG-y | Total NG |
| EGA | 99 | 85 | 184 | 149 | 138 | 287 | 127 | 166 | 293 | 145 | 105 | 250 |
| PCA6 | 18 | 20 | 38 | 17 | 34 | 51 | 16 | 30 | 46 | 18 | 18 | 36 |

In this experiment, the results of fitting at "many locations" (defined as 96 measurement locations across the wafer) were also added to Table 2 for comparison purposes. The "few locations" are defined as 8 measurement locations.

The results summarized in Table 2 evidence that, for all three chosen optimization methods, in terms of total number of measurement locations defined as being No Good, the employment of the basis functions of an embodiment of the invention is consistently better than that of the EGA basis functions (by a factor ranging approximately from 4 to 7). The results point out that, when the few measurement locations are selected judiciously, the fitting advantage provided by the present basis functions over the EGA basis functions is preserved.

It is appreciated that some of the steps of the embodiments of the method of the invention can be effectuated with an electronic circuitry/a processor (that is optionally operably communicated with a system utilizing an embodiment of the invention such as a lithographic exposure tool or a substrate bonding machine, to name just a few) controlled by instructions stored in a tangible, non-transitory storage memory. The memory may be random access memory (RAM), read-only memory (ROM), flash memory or any other memory, or combination thereof, suitable for storing control software or other instructions and data. Some of the functions performed by the processor have been described with reference to flowcharts and/or block diagrams. Those skilled in the art should readily appreciate that functions, operations, decisions, etc. of all or a portion of each block, or a combination of blocks, of the flowcharts or block diagrams may be implemented as computer program instructions, software, hardware, firmware or combinations thereof. Those skilled in the art should also readily appreciate that instructions or programs defining the functions of the present invention may be delivered to a processor in many forms, including, but not limited to, information permanently stored on non-writable storage media (e.g. read-only memory devices within a computer, such as ROM, or devices readable by a computer I/O attachment, such as CD-ROM or DVD disks), information alterably stored on writable storage media (e.g. floppy disks, removable flash memory and hard drives) or information conveyed to a computer through communication media, including wired or wireless computer networks. In addition, while the invention may be embodied in software, the functions necessary to implement the invention may optionally or alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

A couple of notes are in order. The number of measurements M on a training set wafer may depend on how many locations of interest (such as, in the case of semiconductor wafers, through-wafer-vias, for example) there are. In other words, it is preferred to carry out a measurement at every location where the value of distortion is of practical importance. The number of measurements m on testing set may depend, among other factors, on the desired process speed and the noise of measurement system used on the testing set. The number of objects (in one non-limiting example—wafers) needed as part of the training set depends on the number of basis functions intended to be extracted/defined and also on the noise of the measurement system used on the testing set. The number of basis functions (or shapes) intended to be defined/extracted is determined, at least in part, by the need to represent or fit the present distortions to the required specification (precision/accuracy). However, noise of the system may in practice limit the number of basis functions that can be extracted even if these extracted basis functions do not necessarily represent or fit the distortion as required. In alternative implementations of the invention, functions or shapes representing distortions of a surface of precision workpieces from a given batch can be derived based on physical modeling of a precision process that has been used to fabricate the batch. Non-limiting examples of the physical modeling may include the use of a numerical analysis technique (such as a matrix eigendecomposition technique or a statistical screening of data, to name just a few); analysis of the precision process used to fabricate a batch of the precision workpieces (such as assessment of data representing the precision workpieces, or an engineering estimation of chemical interactions that affect a shape of a precision workpiece, or an engineering estimation of mechanical interactions that affect a shape of a precision workpiece, to name just a few).

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description of all features of the invention.

Within this specification, embodiments have been described in a way that enables a clear and concise specification to be written, but it is intended and will be appreciated that embodiments may be variously combined or separated without parting from the scope of the invention. In particular, it will be appreciated that all features described herein are applicable to all aspects of the invention.

In addition, when the present disclosure describes features of the invention with reference to corresponding drawings (in which like numbers represent the same or similar elements, wherever possible), the depicted structural elements are generally not to scale, and certain components are enlarged relative to the other components for purposes of emphasis and understanding. It is to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, at least for purposes of simplifying the given drawing and discussion, and directing the discussion to particular elements that are featured in this drawing. A skilled artisan will recognize that the invention may possibly be practiced without one or more of the specific features, elements, components, structures, details, or characteristics, or with the use of other methods, components, materials, and so forth.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself.

The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

For example, a reference to an identified vector or line or plane being substantially parallel to a referenced line or plane is to be construed as such a vector or line or plane that is the same as or very close to that of the referenced line or plane (with angular deviations from the referenced line or plane that are considered to be practically typical in related art, for example between zero and fifteen degrees, preferably between zero and ten degrees, more preferably between zero and 5 degrees, even more preferably between zero and 2 degrees, and most preferably between zero and 1 degree). For example, a reference to an identified vector or line or plane being substantially perpendicular to a referenced line or plane is to be construed as such a vector or line or plane the normal to the surface of which lies at or very close to the referenced line or plane (with angular deviations from the referenced line or plane that are considered to be practically typical in related art, for example between zero and fifteen degrees, preferably between zero and ten degrees, more preferably between zero and 5 degrees, even more preferably between zero and 2 degrees, and most preferably between zero and 1 degree). As another example, the use of the term "substantially flat" in reference to the specified surface implies that such surface may possess a degree of non-flatness and/or roughness that is sized and expressed as commonly understood by a skilled artisan in the specific situation at hand.

Other specific examples of the meaning of the terms "substantially", "about", and/or "approximately" as applied to different practical situations may have been provided elsewhere in this disclosure.

The invention as recited in claims appended to this disclosure is intended to be assessed in light of the disclosure as a whole, including features disclosed in prior art to which reference is made.

While the invention is described through the above-described exemplary embodiments, it will be understood by those of ordinary skill in the art that modifications to, and variations of, the illustrated embodiments may be made without departing from the inventive concepts disclosed herein. Disclosed aspects, or portions of these aspects, may be combined in ways not listed above. Accordingly, the invention should not be viewed as being limited to the disclosed embodiment(s).

What is claimed is:

1. A method for determining spatial profiles of objects from a set of objects, the method comprising:
   with a shape-profiling tool and for each object from a first subset of objects in said set, measuring a corresponding spatial profile at M spatial locations across said object from the first subset
   i) to determine a measured spatial profile, and
   ii) to define a pre-determined number of basis spatial functions (a) that are orthogonal to each other in a space of a performed measurement, and
   (b) a combination of which approximates the measured spatial profile of each of the objects from the first subset, comprising:
   measuring distortion profiles at the M spatial locations across the object from the first subset to obtain training data;
   defining, based on a machine learning algorithm, spatial functions from the measured spatial profiles using the training data, the spatial functions having corresponding weights; and
   selecting the pre-determined number of spatial functions having the highest weight to be the pre-determined number of basis spatial functions;

with the shape-profiling tool and for each object from a second subset of objects in said set, gauging a corresponding spatial profile at a pre-determined number m of spatial locations across the object from the second set to define profile data; and defining an approximated profile for each of objects in the second subset by fitting said profile data with a linear combination of said basis spatial functions.

2. A method according to claim 1, wherein the gauging includes gauging a corresponding in-surface profile at m spatial locations, wherein m<M.

3. A method according to claim 2, wherein said measuring and said gauging includes using optical sensors, and wherein the objects from the set include wafers.

4. A method according to claim 1, further comprising defining a number M such that a dimensional deviation between the approximated profile and the measured in-surface profile of an object from said second subset set does not exceed the pre-determined value.

5. A method according to claim 1, further comprising defining the first and second subsets as complementary subsets.

6. A method according to claim 1, wherein each of said measuring and said defining includes determining in-plane distortions of wafers that have been identified for processing in a lithographic exposure tool.

7. A method according to claim 1, wherein said measuring a corresponding spatial profile at M spatial locations across the object from the first subset includes measuring said profile with a set of M optical sensors, one sensor per location, and wherein gauging a corresponding spatial profile at m<M spatial locations across the object from the second set includes measuring said profile with a set of m optical sensors, one sensor per location.

8. A method according to claim 1, further comprising affixing to one another first and second objects approximated profiles of which have been defined.

9. A method according to claim 8, wherein said first and second objects include semiconductor wafers and said affixing includes bonding the first wafer and the second wafer in a substrate bonding apparatus.

10. A method for determining spatial profiles of objects, the method comprising:

with a shape-profiling tool and for each object from a first subset of the objects, measuring a corresponding spatial profile with M sensors of the tool to define a pre-determined number of basis spatial functions (a) that are orthogonal to each other in a space of a performed measurement, and (b) a combination of which approximates a measured spatial profile of each of the objects from the first subset, comprising:

measuring distortion profiles at the M sensors across an object from the first subset to obtain training data;

defining, based on a machine learning algorithm, spatial functions from the measured spatial profiles, the spatial functions having corresponding profiles using the training data, and selecting the pre-determined number of spatial functions having the highest weight to be the pre-determined number of basis spatial functions; and defining an approximated spatial profile for each of objects in the second subset of the objects by fitting profile data, obtained from a measurement of each of the objects in the second subset with m sensors, with a combination of the pre-determined basis spatial functions.

11. A method according to claim 10, wherein objects include semiconductor wafers.

12. A method according to claim 11, further comprising affixing to one another first and second objects, approximated spatial profiles of which have been defined, in a substrate bonding apparatus.

13. A method according to claim 10, wherein said measuring includes measuring a corresponding in-plane profile of a semiconductor wafer.

14. A method according to claim 10, wherein said defining an approximated spatial profile includes defining an approximated in-plane profile of a semiconductor wafer.

15. A method according to claim 10, wherein said defining includes measuring each of the objects in the second subset with m sensors, wherein m<M.

16. A method according to claim 10, wherein at least one of said measuring a corresponding spatial profile and said defining an approximated spatial profile include includes simultaneously measuring an object with multiple sensors.

17. A method according to claim 10, wherein each of said measuring and defining includes determining in-plane distortions of wafers that have been identified for processing in a lithographic exposure tool.

18. A method according to claim 10, wherein said measuring and defining are effectuated for at least two batches of objects, each batch having been fabricated independently from another batch, and wherein basis spatial functions that have been defined based on measuring a first subset of objects of one batch differs from basis spatial functions that have been defined based on measuring a first subset of objects in another batch.

19. A method for determining spatial profiles of objects, the method comprising:

determining an approximated spatial profile for each of the objects by fitting profile data, obtained from a simultaneous optical measurement of one subset of the objects at M locations across each object, with a set of basis functions that (i) are orthogonal to each other in a space of said optical measurement, and (ii) have been defined from a simultaneous optical measurement of another subset of the objects atm locations across each object, comprising:

measuring distortion profiles at the M locations across an object from the one subset to obtain training data;

defining, based on a machine learning algorithm, spatial functions from the spatial profiles, the spatial functions having corresponding profiles using the training data, and selecting a pre-determined number of spatial functions having the highest weight to be in the set of basis functions.

20. A method according to claim 19, further including defining the set of basis functions from the simultaneous optical measurement of another subset of the objects at M locations across each object, wherein m<M.

* * * * *

UNITED STATES PATENT AND TRADEMARK OFFICE
CERTIFICATE OF CORRECTION

PATENT NO. : 10,718,606 B2
APPLICATION NO. : 15/099346
DATED : July 21, 2020
INVENTOR(S) : Travis D. Bow, Henry Kin Heng Pang and Fardad A. Hashemi It is certified that error appears in the above-identified patent and that said Letters Patent is hereby corrected as shown below:

On the Title Page

Item (56), U.S. patent documents, cite no. 3, delete "Den Boer et al." and insert --Den Boef et al.--, therefor.

In the Claims

In Column 16, Line(s) 47, Claim 19, delete "atm" and insert --at $m$--, therefor.

Signed and Sealed this
Twenty-second Day of December, 2020

Andrei Iancu
*Director of the United States Patent and Trademark Office*